United States Patent [19]
Hong

[11] Patent Number: 5,008,156
[45] Date of Patent: Apr. 16, 1991

[54] PHOTOCHEMICALLY STABLE MID AND DEEP ULTRAVIOLET PELLICLES

[75] Inventor: Gilbert H. Hong, Los Altos Hills, Calif.

[73] Assignee: Exion Technology, Inc., San Jose, Calif.

[21] Appl. No.: 280,702

[22] Filed: Dec. 6, 1988

Related U.S. Application Data

[63] Continuation-in-part of Ser. No. 929,060, Nov. 7, 1986.

[51] Int. Cl.$^5$ ............................................. B32B 27/08
[52] U.S. Cl. .................................... 428/506; 428/522; 428/524; 428/527; 350/1.6; 350/164; 350/582; 430/5
[58] Field of Search ............... 428/501, 506, 527, 524, 428/522; 350/1.6, 164, 582; 430/524, 5

[56] References Cited

U.S. PATENT DOCUMENTS

| | | | |
|---|---|---|---|
| 4,131,363 | 12/1978 | Shea et al. | 355/75 |
| 4,378,953 | 4/1983 | Winn | 264/311 |
| 4,476,172 | 10/1984 | Ward | 428/38 |
| 4,482,591 | 11/1984 | Ward | 428/66 |
| 4,499,231 | 2/1985 | Ward et al. | 524/506 |
| 4,523,974 | 1/1985 | Duly et al. | 156/630 |
| 4,536,240 | 8/1985 | Winn | 156/74 |
| 4,657,805 | 4/1987 | Fukumitsu et al. | 428/215 |

FOREIGN PATENT DOCUMENTS

| | | | |
|---|---|---|---|
| 0117117 | 7/1984 | Japan | 430/5 |
| 0083032 | 5/1985 | Japan | 430/5 |

OTHER PUBLICATIONS

Ron Hershel, Pellicle Protection of Integrated Circuit (IC) Masks, SPIE, vol. 275, Semiconductor Microlithography VI, 1981, 23–28.

R. Iscoff, Pellicle 1985, An update, Semiconductor International, Apr. 1985.

I. Ward and D. Duly, Optical Microlithograph III: Technology for the Next Decade, SPIE, vol. 470, pp. 147–154 (H. L. Stover, Editor), 1984.

F. W. Billmeyer, Jr., Textbook of Polymer Science, pp. 468–470 (John Wiley and Sons, Inc., 2nd ed., 1971).

*Primary Examiner*—Merrell C. Cashion, Jr.
*Assistant Examiner*—D. S. Nakarani
*Attorney, Agent, or Firm*—Thomas E. Schatzel

[57] ABSTRACT

Mid and deep ultraviolet light transmitting pellicles for protecting photomasks from particle contamination during a projection printing process. The pellicles are manufactured from polyglycidyl-methacrylate-ethacrylate copolymer, from polyvinyl butyral polymer or from nitrocellulose. The polyvinyl butyral pellicle is sandwiched between two layers of an antireflective coating of poly-1H, 1H Pentadecafluorooctyl methacrylate or poly-1H, 1H Pentadecafluorooctyl acrylate. The nitrocellulose pellicle includes two double layers of antireflective material with the first double layer positioned on one side of the nitrocellulose layer and comprising a layer of the thermoplastic phenolic resin novalac and a layer of either poly-1H, 1H Pentadecafluorooctyl methacrylate or poly-1H, 1H Pentadecafluorooctyl acrylate. The second double layer is positioned on the other side of the nitrocellulose layer and comprises a layer of novolac and a layer of either poly-1H, 1H Pentadecafluorooctyl methacrylate or poly-1H, 1H Pentadecafluorooctyle acrylate.

18 Claims, 3 Drawing Sheets

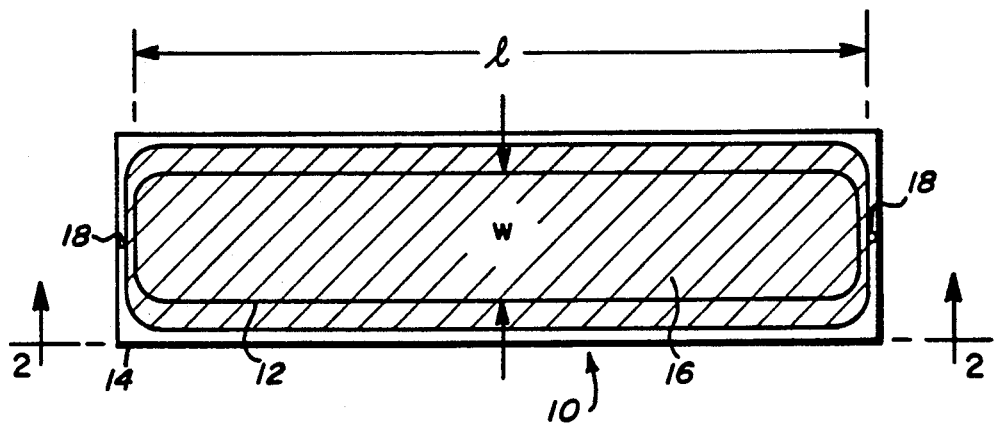
Fig_1
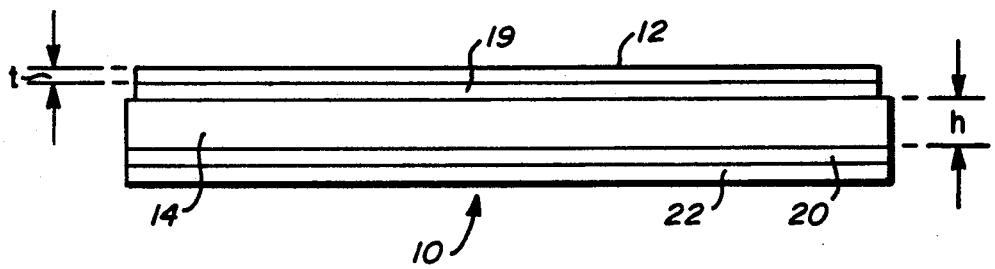
Fig_2
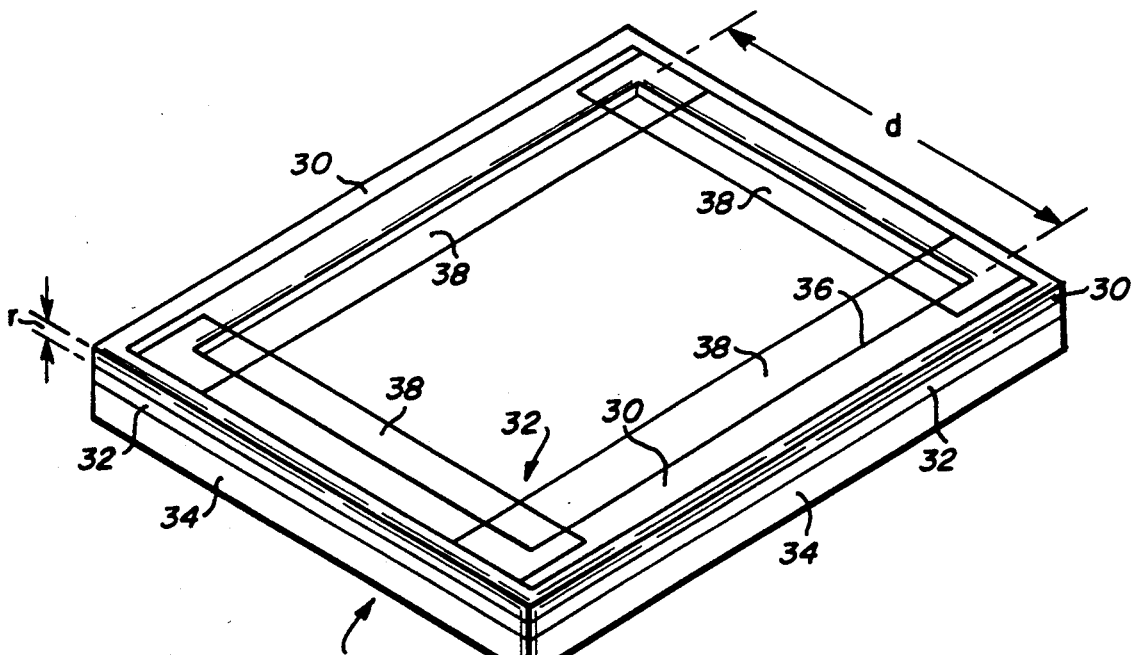
Fig_3

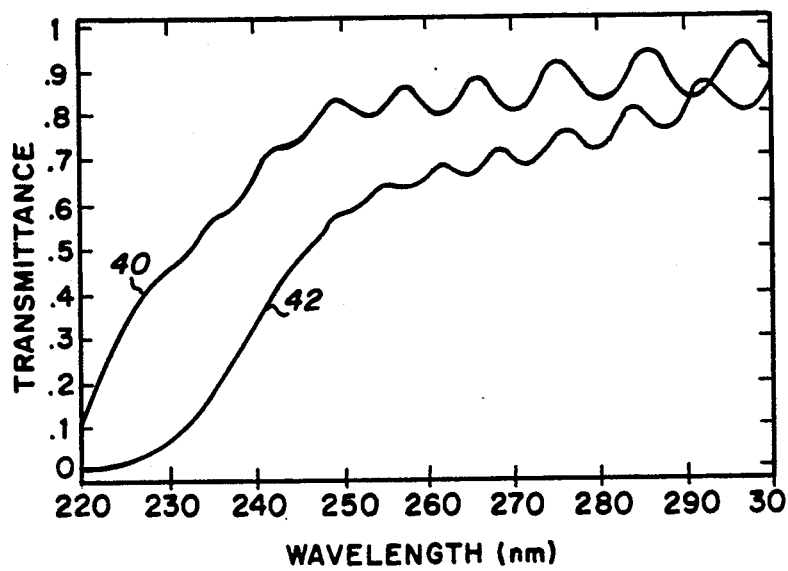
Fig_4
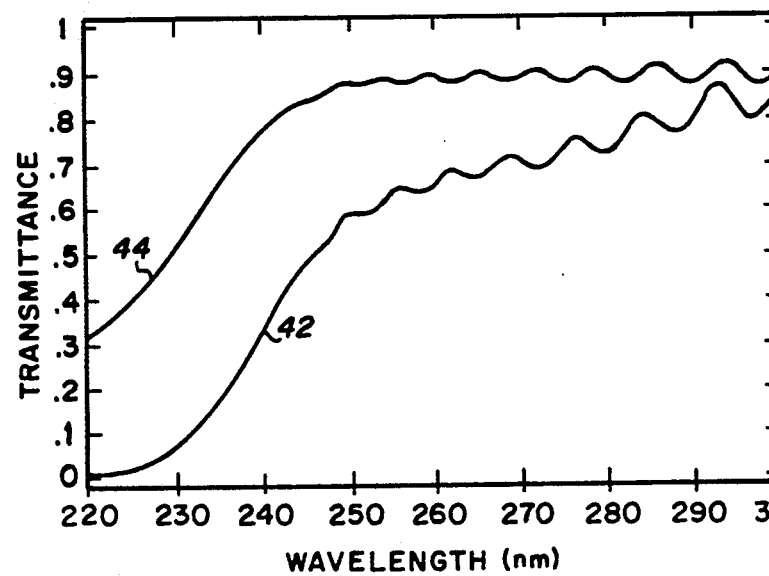
Fig_5
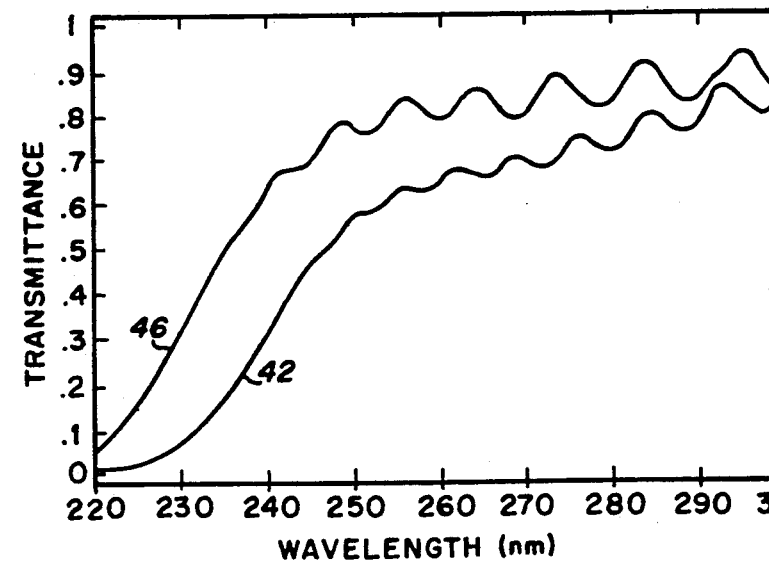
Fig_6

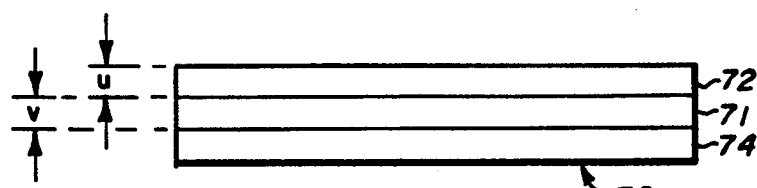
Fig_7
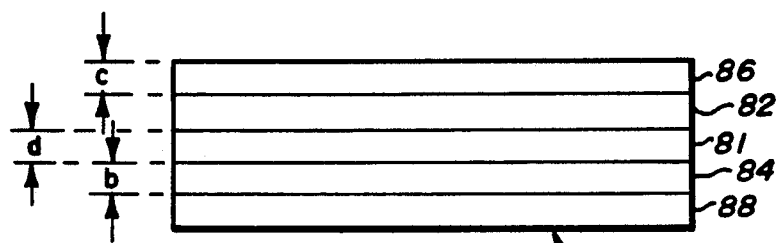
Fig_8
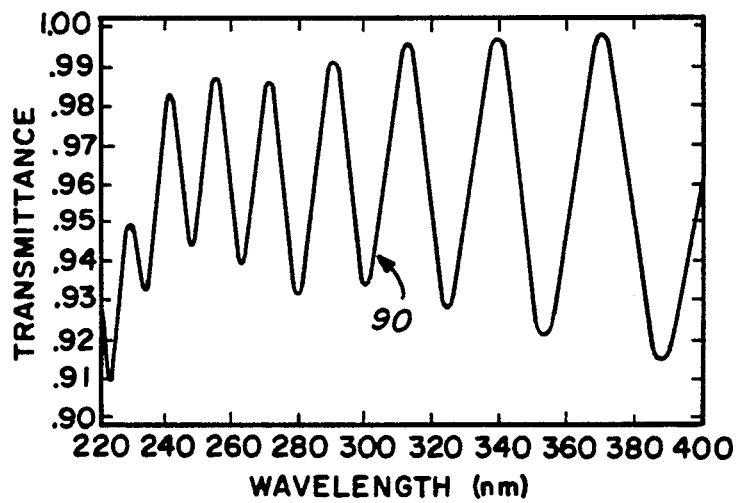
Fig_9
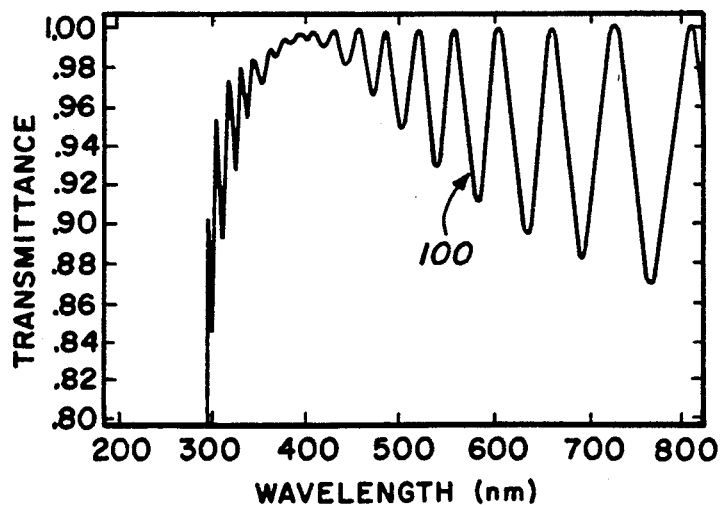
Fig_10

PHOTOCHEMICALLY STABLE MID AND DEEP ULTRAVIOLET PELLICLES

This is continuation-in-part application of copending U.S. application Ser. No. 06/929,060, filed Nov. 7, 1986, now abandoned.

BACKGROUND OF THE INVENTION

1. Field of the Invention

The present invention relates to pellicles for protecting photomasks from particulate contamination and more particularly to pellicles suitable for use with mid and deep ultraviolet radiation.

2. Description of the Prior Art

Pellicles are thin, transparent membranes or films generally manufactured from a polymeric material. Their function is to act as a dust cover and to hold particulate matter outside of the focal plane of an optical apparatus.

Pellicles are widely used in the integrated circuit manufacturing process both to protect photomasks from particulate contamination and to extend the mask life. The importance of pellicles to semiconductor manufacturers is reviewed in an article by Ron Iscoff. See R. Iscoff, *Pellicles 1985: An Update, Semiconductor International* (Apr. 1985).

The use of pellicles in conjunction with a projection printing system was described by Shea, et al in U.S. Pat. 4,131,363, issued Dec. 26, 1978. More recently, a broad class of pellicles and a method for forming these pellicles was described by Winn in U.S. Pat. Nos. 4,378,953 and 4,536,240, issued on Apr. 5, 1983 and Aug. 20, 1985, respectively.

Currently, the material most widely used in pellicle manufacturing is nitrocellulose. As a raw material, the attractiveness of nitrocellulose is reduced because it is highly flammable and must be stored in a wetted condition. Additionally, nitrocellulose is somewhat hygroscopic and this property makes manufacturing under humid conditions difficult. As a finished product, nitrocellulose pellicles wrinkle when wetted with water thus making cleaning or storing under humid conditions difficult.

A more important problem with nitrocellulose pellicles is that nitrocellulose does not transmit ultraviolet (UV) light very well. Below two hundred and sixty nanometers, nitrocellulose transmits less than seventy percent (70%) of incident light. This limitation in a nitrocellulose pellicle (and also in mylar pellicles) was documented by R. Hershel in *Pellicle Protection of IC Masks*, Report by Hershel Consulting, Inc. (August 1981). Additionally, the irradiation of nitrocellulose pellicles with ultraviolet light causes the pellicle to become discolored thus further reducing its transparency.

The need for pellicles which transmit UV light arises because improvements in the lithographic process used in manufacturing integrated circuits are dependent on reducing the wavelength of the incident light used. One project undertaken to develop a broadband pellicle capable of transmitting UV light is described by I.E. Ward and D.L. Duly in *Optical Microlithography III: Technology for the Next Decade, SPIE,* Vol. 470, pp. 147–154 (H.L. Stover - Editor) (1984). This paper also discloses the use of an unspecified antireflective layer coated on one or both sides of the pellicle to reduce optical interference.

Optical interference is caused by internal reflection of light within the pellicle and is evidenced by oscillating behavior in the transmission spectrum of the pellicle. Current approaches to dealing with this problem include applying antireflective (AR) coatings to the pellicle and controlling the thickness of the pellicle. As noted by Hershel and Ward and Duly, supra, a problem with AR coatings is that they do not adhere well to the pellicle surface. This imperfect adhesion results in cracking and flaking of the AR coating which ruins the pellicle.

In U.S. Pat. No. 4,657,805, issued Apr. 14, 1987, Fukumitsu, et al disclose the use of thin fluoropolymer films as antireflective layers for a pellicle. Multiple layers of the fluoropolymer films are coated on a core layer pellicle to form a five-layer pellicle structure with the indexes of refraction of the various layers being chosen to reduce internal reflection and scattering.

The UV transmitting pellicles of Ward are described more completely in a series of three patents. U.S. Pat. No. 4,482,591, issued Nov. 13, 1984 discloses a pellicle comprised of polyvinyl butyral resin (PBR) and the use of a ring with an adhesive side to remove the pellicle from a wafer. U.S. Pat. No. 4,499,231, issued Feb. 12, 1985 discloses a pellicle comprising PBR and a dispersion of colloidal silica. U.S. Pat. No. 4,476,172, issued Oct. 9, 1984 discloses pellicles comprised of a PBR derivative that includes a silane moiety.

Problems also exist in the processes used to manufacture pellicles. For example, typically, a pellicle is formed by depositing a polymer solution on an inert substrate and then evaporating the solvent. This leaves the pellicle coated on the inert substrate. Removing the delicate pellicle from the substrate is a difficult, but necessary step in the process. U.S. Pat. No. 4,536,240 by Winn, discloses a method for accomplishing this task by bonding a frame to the pellicle and then peeling the pellicle off the substrate. In conjunction with this procedure, a suitable release agent can be applied to the substrate prior to applying the polymer solution and aid in removing the pellicle. Using this procedure, however, still results in many pellicles being ripped during the removal step.

Duly, et al., in U.S. Pat. No. 4,523,974, issued June 18, 1985, disclose a method for manufacturing a pellicle from polymethylmethacrylate (PMMA) that includes the steps of applying a gold film to the surface of an oxidized wafer, coating a thin layer of PMMA on the gold film, removing the PMMA and gold layers from the wafer and etching off the gold layer.

SUMMARY OF THE PRESENT INVENTION

It is therefore an object of the present invention to provide improved pellicles capable of transmitting mid and deep ultraviolet light.

It is another object of the present invention to provide an improved polyvinyl butyral pellicle.

It is another object of the present invention to provide polyvinyl butyral pellicles that include a compatible antireflective coating.

It is still another object of the present invention to provide an improved nitrocellulose pellicle with multiple layers of antireflective coating.

It is another object of the present invention to provide improved pellicles which are good substrates for applying antireflective material.

It is another object of the present invention to provide improved pellicles that possess photochemical stability in the two hundred and forty to three hundred nanometer wavelength range.

Briefly, the preferred embodiment of the present invention includes a pellicle comprising a core layer of polyvinyl butyral resin (PBR) sandwiched between two antireflective layers comprised of poly-1H, 1H Pentadecafluorooctyl methacrylate or poly-1H, 1H Pentadecafluorooctyl acrylate.

The polyvinyl butyral resin has the formula:

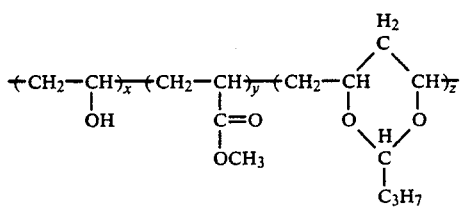

where x is in the range of 0.09 to 0.21;
y is in the range of 0 to 0.025; and
z is in the range of 0.80 to 0.88.

Therefore, the PBR pellicle of the present invention can be manufactured from a wider range of materials than the PBR pellicles described in the prior art (see e.g., U.S. Pat. No. 4,482,591). The pellicle comprised of these materials yields a transmittance of greater than 94% over the spectral range of 240 to 280 nm.

In another embodiment of the present invention, a five-layer pellicle comprises a core layer of nitrocellulose sandwiched between two inner layers of the thermoplastic phenolic resin novolac (trademark Alnovol) and two outer layers of poly-1H, 1H Pentadecafluorooctyl methacrylate or poly-1H, 1H Pentadecafluorooctyl acrylate. The pellicle comprised of these materials yields a transmittance of greater than 98% over the approximate range of 350 to 450 nm. The amount of stress between the layers is reduced because all the materials are organic polymers having similar thermal and mechanical properties. Additionally, the indices of refraction for the various layers are well matched.

In other embodiments, pellicles are manufactured from polymethylmethacrylate polymer, polyglycidylmethacrylate-ethylacrylate copolymer or from nitrocellulose. Additionally, layered pellicles manufactured by stacking two or more pellicles, made from different materials, on top of each other are described.

An advantage of the present invention is that the new polyvinyl butyral and polyglycidylmethacrylate-ethylacrylate copolymer pellicles transmit substantial amounts of light having a wavelength as short as two hundred and forty nanometers.

Another advantage of the present invention is that the new polyvinyl butyral pellicles are comprised of a wider range of materials than polyvinyl butyral pellicles of the prior art.

Another advantage of the present invention is that the new polyvinyl butyral pellicles include an antireflective layer of poly-1H, 1H Pentadecafluorooctyl methacrylate or poly-1H, 1H Pentadecafluorooctyl acrylate.

Another advantage of the present invention is that the use of multiple novolac polymer and poly-1H, 1H Pentadecafluorfooctyl methacrylate or poly-1H, 1H Pentadecafluorooctyl acrylate antireflective layers with a nitrocellulose core layer results in a nitrocellulose pellicle having both reduced interlayer stress and matched indices of refraction between the multiple layers.

Another advantage of the present invention is that the new pellicles are good substrates for applying antireflective material.

Another advantage of the present invention is that the improved pellicles possess photochemical stability in the two hundred and forty to three hundred nanometer wavelength range.

These and other objects and advantages of the present invention will no doubt become apparent to those skilled in the art after having read the following detailed description of the preferred embodiment which is illustrated in the various drawing figures.

BRIEF DESCRIPTION OF THE DRAWINGS

FIG. 1 illustrates an edge-mounted pellicle of the present invention;

FIG. 2 is a side view of the edge-mounted pellicle taken along line 2—2 of FIG. 1;

FIG. 3 illustrates a frame for removing pellicles from a substrate;

FIG. 4 illustrates the transmission spectrum of a polymethylmethacrylate pellicle versus a nitrocellulose pellicle;

FIG. 5 illustrates the transmission spectrum of a polyglycidylmethacrylate-ethylacrylate copolymer pellicle versus a nitrocellulose pellicle;

FIG. 6 illustrates the transmission spectrum of a double layered polymethylmethacrylate/nitrocellulose pellicle versus a nitrocellulose pellicle;

FIG. 7 illustrates a side view of a polyvinyl butyral pellicle according to the present invention;

FIG. 8 illustrates a side view of a multi-antireflective layer nitrocellulose pellicle according to the present invention;

FIG. 9 illustrates the transmission spectrum of the polyvinyl butyral pellicle shown in FIG. 7; and FIG. 10 illustrates the transmission spectrum of the multi-antireflective layer nitrocellulose pellicle shown in FIG. 8.

DETAILED DESCRIPTION OF THE PREFERRED EMBODIMENT

Referring now to FIG. 1, there is illustrated an edge-mounted pellicle of the present invention referred to by the general reference numeral 10. A pellicle 12 is mounted on one face of a rectangular frame 14. The frame 14 includes a space 16 in the approximate middle of frame 14 and has a width "w" and a length "l". Width "w" and length "l" are chosen such that adequate surface area remains on frame 14 for attaching pellicle 12. Frame 14 also includes a pair of holes 18. Holes 18 are used to facilitate removing the edge-mounted pellicle 10 from a photomask. The frame 14 could have shapes other than rectangular.

FIG. 2 shows a side view of the edge-mounted pellicle 10. From this prospective, it can be seen that pellicle 12 has a thickness "t" and that frame 14 has a height "h". A first adhesive layer 19 is positioned between frame 14 and pellicle 12. A second adhesive layer 20 is coated on the opposite face of the frame 14 from which the pellicle 12 is attached. A removable, protective strip 22 covers adhesive layer 20.

FIG. 3 shows a membrane assembly 28 which consists of a square frame 30, an uncut pellicle 32 and a substrate 34. The square frame 30 is used during the pellicle manufacturing process to remove the pellicle 32 from the substrate 34. In the approximate center of square frame 30, a square space 36 is cut which exposes the underlying pellicle 32. A plurality of adhesive strips 38 are attached along the perimeter of space 36 binding the square frame 30 to the underlying pellicle 32. Square frame 30 has an internal length "d" and a thickness "r".

FIG. 4 illustrates a transmission spectrum 40 of the pellicle 12 when pellicle 12 is manufactured from polymethylmethacrylate (PMMA). A reference transmission spectrum 42 of a pellicle 12 manufactured from nitrocellulose is also shown.

FIG. 5 illustrates a transmission spectrum 44 of the pellicle 12 when pellicle 12 is manufactured from a copolymer of glycidylmethacrylate and ethylacrylate (COP). The reference spectrum 42 is also shown for comparison to spectrum 44.

FIG. 6 illustrates a transmission spectrum 46 of the pellicle 12 when pellicle 12 is manufactured from a double layer of polymethylmethacrylate and nitrocellulose. The reference spectrum 42 is shown for comparison to spectrum 46.

FIG. 7 illustrates polyvinyl butyral pellicle 70 comprising a core layer 71 comprised of polyvinyl butyral resin (PBR) having an index of retraction of approximately 1.48 and having the formula (1) shown below:

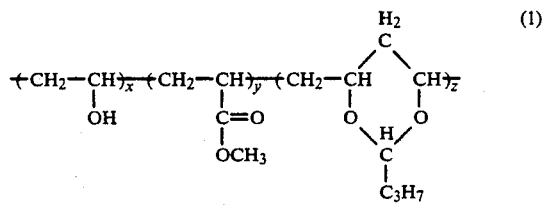

An upper antireflective layer 72 and a lower antireflective layer 74 are positioned on opposite surfaces of the core layer 71 and are in contact with the core layer 71. Both the upper layer 72 and the lower layer 74 are comprised of poly-1H, 1H Pentadecafluorooctyl methacrylate having an index of refraction of approximately 1.35 and having the formula (2) shown below:

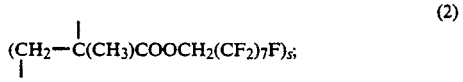

or poly-1H, 1H Pentadecafluorooctyl acrylate having an index of refraction of approximately 1.35 and having the formula (3) shown below:

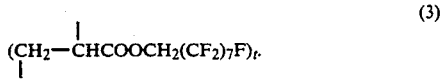

Alternatively, the upper layer 72 could be comprised of the methacrylate compound shown in formula (2) and the lower layer 74 could be comprised of the acrylate compound shown in formula (3). The layers 72 and 74 each have a thickness "u" and the core layer 70 has a thickness "v".

FIG. 8 illustrates a multi-antireflective layer pellicle 80 comprising a core layer 81 positioned between an upper antireflective layer 82 and a lower inner antireflective layer 84. The inner layers 82 and 84 are positioned on opposite surfaces of the core layer 81 and are in contact with the core layer 81. An upper outer antireflective layer 86 is positioned along, and in contact with, a surface of the upper layer 82. Similarly, a lower outer antireflective layer 88 is positioned along, and in contact with, a surface of the lower layer 84. The inner layers 82 and 84 are comprised of the thermoplastic phenolic resin novolac, have a thickness "b" equal to approximately one quarter of the wavelength of the light source used in the projection printing process and have an index of refraction equal to approximately 1.70. Novolac has the formula (4) shown below:

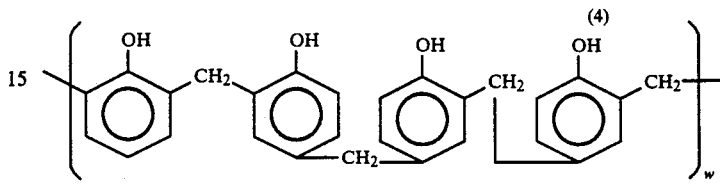

In the structure of novolac, the bridging methylene groups are randomly linked between ortho and para positions and molecular weights may range as high as 1000 which corresponds to about ten phenyl residues. See, F.W. Billmeyer, Jr., *Textbook of Polymer Science*, pp. 468–470, (John Wiley and Sons, Inc. 2d ed. 1971). The outer layers 86 and 88 are comprised of poly-1H, 1H Pentadecafluorooctyl methacrylate or poly-1H, 1H Pentadecafluorooctyl acrylate, have a thickness "c" approximately equal to one quarter of the wavelength of the light source used in the projection printing process and have an index of refraction of approximately 1.35. The core layer 81 has a thickness "d".

FIG. 9 illustrates a transmission spectrum 90 of the pellicle 70. As can be seen in FIG. 9, the pellicle 70 yields a transmittance of greater than 94% over the spectral range of 240 to 280 nm and has greater than 96% transmittance at 248 nm.

FIG. 10 illustrates a transmission spectrum 100 of the pellicle 80. As can be seen in FIG. 10, the pellicle 80 yields a transmittance of greater than 98% over the spectral range of 350 to 450 nm.

In the present invention, the pellicles 12 and 70 comprise a thin film of a polymer which transmits significant amounts of light at two hundred forty nanometers (i.e. at least sixty percent) and which possess adequate photochemical stability in the two hundred forty to three hundred nanometer wavelength range (i.e. does not noticeably decompose when irradiated for at least three hours with two hundred forty to three hundred nanometer wavelength light). Three materials which are known to have these properties are the polymethylmethacrylate polymer, the polyglycidylmethacrylate-ethylacrylate copolymer and the polyvinyl butyral polymer. Additionally, the polymer film of pellicle 12 can be either a single layer of one polymer or it can be formed by stacking two or more pellicles of different polymers on top of each other. Ideally, polymers with molecular weights of approximately four hundred thousand daltons are used. This yields pellicles with optimal tensile strength. However, polymers with molecular weights in the range of ten thousand to one million daltons are satisfactory.

The pellicles 12, 70 and 80 of the present invention are manufactured by preparing a coating solution of the polymer in a solvent. This solution can be filtered through a 0.2 micron or smaller pore-size filter to remove undissolved particular matter. Ideally, all of the manufacturing procedures disclosed in this application should be conducted in a class one hundred or better clean room to avoid airborne contamination.

After filtering, the polymer solution is applied to a superflat, smooth, defect-free substrate using a spin-coating technique. Spin-coating is a technique widely used in the semiconductor industry for obtaining polymer films and most of the accepted industry practices for obtaining defect-free coatings can be adapted to pellicle manufacturing. Generally, a spinning speed of about one thousand rpm should be used for obtaining a high quality two to three micron pellicle.

Typically, with the present invention, it has been found that soda-lime glass substrates yield the best results in spin-coating. Prior to use, the glass substrate should be cleaned according to the following protocol:
1. Scrub the substrate in deionized (DI) water with detergent;
2. Rinse the substrate copiously with DI water;
3. Rinse the substrate with isopropyl alcohol using ultrasonic agitation; and
4. Dry the substrate in a freon degreaser tank.

After the spin-coating process has been completed, residual solvent is removed from the pellicle by heating in a superclean oven for about thirty minutes at approximately 60° to 90° C. This heating process also serves to increase pellicle tensile strength by reducing polymer stress. Additional layers can be added through additional spin-coating steps.

In certain applications, after drying, the pellicle is peeled-off of the glass substrate before it is mounted on a frame. This improves the yield of pellicles by reducing pellicle breakage. This peel-off procedure involves using the square frame 30 shown in FIG. 3. Typically, square frame 30 is manufactured from stainless steel and has a thickness "r" of about twenty thousandths of an inch and an internal length "d" of either six or seven inches depending on the size of pellicle 32. Square frame 30 is useful because it has much greater flexibility than frame 14.

In the general peel-off procedure, square frame 30 is attached to the pellicle 32 by use of adhesive strips 38 as shown in FIG. 3. It has been determined that 3M brand magic scotch tape is suitable for use as adhesive strips 38. The membrane assembly 28, with glass on one side and the square frame 30 on the other, is submerged into or sprayed with DI water for about five minutes. An adhesion failure at the pellicle-glass interface is induced by the parting action of the DI water causing pellicle 32 to separate from the glass substrate and remain attached to square frame 30. Either gentle heating or ambient evaporation heating is then used to remove water droplets from the surface of general pellicle 32.

After peel-off and drying, the pellicle 32 can be transferred to frame 14. This is most readily accomplished by placing the square frame 30 containing pellicle 32 on top of frame 14 to which a permanent adhesive has previously been applied. After the permanent adhesive has hardened, the pellicle 32 is separated from square frame 30 by trimming away excess pellicle material along frame 14 to yield edge-mounted pellicle 10.

In typical applications, the pellicle thickness "t", in FIG. 2, is chosen as either 0.85 microns or 2.83 microns. In alternative embodiments, the pellicle thickness "t" can be varied to reduce optical interference effects or to alter the strength of pellicle 12. The height of frame 14, "h" in FIG. 2, can also be varied depending on the particular application of edge mounted pellicle 10. In the preferred embodiment, height "h" is approximately one millimeter. At this distance, particular matter collecting on pellicles 12, 70 or 80 will not be printed during the photolithographic process.

Several examples of representative procedures used to prepare pellicles 12, 70 or 80 of the present invention are given below:

EXAMPLE 1

A polymethylmethacrylate pellicle 12 is manufactured by preparing a coating solution of polymethylmethacrylate (PMMA) in chlorobenzene having a solid content of roughly nine percent (9% w/w). PMMA having a molecular weight of approximately five hundred thousand daltons should be used. This raw material is available from DuPont under the trade name "Elvacite" and is also available in generic form from Aldrich Chemical Company. This PMMA coating solution is then filtered, spin-coated, dried and peeled off the substrate using the procedures previously described. With proper adjustment of the solid polymer content and spinning speed, pellicle thickness "t" of between 0.5 micrometers and 3.0 micrometers can be obtained.

The uncut pellicle 32 obtained from this procedure can then be transferred to the frame 14 using the previously described transfer procedure to yield pellicle 12. Three permanent adhesives which work satisfactorily for bonding pellicle 12 to frame 14 are: five-minute epoxy by Devcon in ethyl acetate, 3M brand 4475 epoxy in ethyl acetate and nitrocellulose in ethyl acetate. The adhesive concentration can be varied to achieve different curing times.

Comparison of curves 40 and 42 in FIG. 4 shows the improvement in transmittance for the PMMA pellicle (curve 40) versus a nitrocellulose pellicle (curve 42).

The photochemical stability of the PMMA and nitrocellulose pellicles was tested with a Loctite Zeta 7000 U.V. light source equipped with a high pressure mercury lamp by irradiating the two pellicles for several hours. The nitrocellulose pellicle showed noticeable discoloration after one hour whereas the PMMA pellicle showed no signs of discoloration after five hours.

EXAMPLE 2

A polyglycidylmethacrylate-ethylacrylate copolymer (COP) pellicle 12 is manufactured by preparing a coating solution of COP in chlorobenzene having a solid content of approximately eleven percent (11%). COP having a molecular weight of approximately 200,000 should be used. This raw material is available from Mead or can be synthesized. This COP coating solution is then filtered, spin-coated, dried and peeled off the substrate using the procedures previously described.

The COP pellicle 12 can be permanently bonded to the frame 14 with Devcon five minute epoxy in ethyl acetate.

Comparison of curves 42 and 44 in FIG. 5 shows the improvement in transmittance for the COP pellicle (curve 44) versus a nitrocellulose pellicle (curve 42). Photochemical stability comparable to that of the PMMA pellicle was observed for the COP pellicle.

EXAMPLE 3

A nitrocellulose (NC) pellicle 12 is manufactured by preparing a coating solution of NC in 2-ethoxyethylacetate having a solid content of from five to fifteen percent (5–15%)(w/w). The raw material is obtainable from Hercules Chemical Corp. under the designation "RS ½ second with a viscosity of 3 to 4". This material comes wetted with approximately thirty percent (30%) isoproponal. This NC coating solution is then filtered, spin-coated, dried and peeled off the substrate using the procedures previously described. An advantage of the NC/2-ethoxyethylacetate coating solution is that it is less sensitive to atmospheric moisture than other NC coating solutions.

The NC pellicle 12 can be permanently bonded to frame 14 with Loctite 363 U.V. curable adhesive.

The reference curves 42 in FIGS. 4, 5 and 6 show the transmission spectrum of the NC pellicle 12.

EXAMPLE 4

A double layered PMMA/NC pellicle 12 is manufactured by spin-coating a NC coating solution on a substrate as in example 3 and drying it and then spin-coating a PMMA coating solution from example 1 on top of the NC pellicle. After drying, the PMMA/NC pellicle 12 can be peeled off the substrate using the procedures previously described. Because the NC pellicle layer is now on the bottom face of the square frame 30, it is the NC pellicle layer that will be bonded to frame 14. Hence, the Loctite 363 U.V. curable adhesive from example 3 should be used to bond the PMMA/NC pellicle 12 to frame 14.

The PMMA/NC pellicle 12 has a desirable structure because the top layer, made from PMMA, is not hygroscopic and the bottom layer, made from NC, is less brittle than the upper PMMA layer. Other multiple layer pellicles could be used to reduce costs, maximize yields or modify optical properties of a pellicle. As shown in FIG. 6, the double layered PMMA/NC pellicle 12 has a transmission spectrum (curve 46) that is a combination of the PMMA spectrum (curve 40) and the NC spectrum (curve 42).

EXAMPLE 5

The polyvinyl butyral pellicle 70 is manufactured by forming a polymer solution by dissolving a polyvinyl butyral resin in a suitable solvent. The polymer solution is coated on a clean glass substrate and dried to form the core layer 71. An anti-reflective (AR) solution is formed by dissolving poly-1H, 1H Pentadecafluorooctyl methacrylate in a suitable solvent and spin coating the upper antireflective layer 72 on the core layer 71. The film comprised of the layers 71 and 72 is peeled from the glass substrate with the aid of a metal frame and the film is transferred to another metal frame with the uncoated surface of the core layer 71 exposed (away from the frame). The layer 74 is coated on the core layer 71 to complete the pellicle 70.

Resins suitable for use in this procedure are marketed by Monsanto under the tradename Butvar ®. The resins marketed as Butvar 72, Butvar 79 and Butvar 90 are especially suitable for the manufacturing of pellicles. Relevant parameters for these resins are listed in Table 1.

TABLE 1

| Property | Butvar 72 | Butvar 79 | Butvar 90 |
|---|---|---|---|
| Average Molecular Wt. | 180,000–270,000 | 34,000–38,000 | 38,000–45,000 |
| $x^*$-hydroxyl content expressed as % polyvinyl alcohol | 17.5–21.0 | 9.0–13.0 | 18.0–20.0 |

TABLE 1-continued

| Property | Butvar 72 | Butvar 79 | Butvar 90 |
|---|---|---|---|
| $y^*$-acetate content expressed as % polyvinyl acetate | 0–2.5 | 0–2.5 | 0–1.0 |
| $z^*$-butyral content expressed as % polyvinyl butyral | 80 | 88 | 80 |

*$x$, $y$ and $z$ refer to the subscripts in formula (1)

In the actual procedure, the core layer 71 is formed by dissolving 150 grams of Butvar 79 in 1100 ml. of 2-ethoxyethyl acetate and the solution is spin coated on a glass substrate. The core layer 71 and substrate are dried in an oven at 60° C. The upper layer 72 is formed from a coating solution made by mixing a 2.0% solution of poly-1H, 1H Pentadecafluorooctyl methacrylate in a fluorinated hydrocarbon solvent (e.g. 1, 1, 2 trichlorotrifluoroethane) with an equal volume of perfluoroalkane solvent such as 3M's FC 40. The coating solution is spin coated on the core layer 71 and the ensemble is dried by heating in an oven at 60° C.

The combination of the core layer 71 and the upper layer 72 are peeled off the substrate with the aid of a metal frame and the lower layer 74 is formed by spin coating the exposed surface of the core layer 71 with the coating solution and drying the ensemble by heating in an oven at 60° C.

This manufacturing procedure yields the three-layer pellicle 70 having the transmission spectrum 90 shown in FIG. 9. The thicknesses u and v for the layers 72 and 71 are approximately 0.1 microns and 2.85 microns, respectively. The thickness of the layer 74 is approximately equal to the thickness of the layer 72. The thickness u of the layers 72 and 74 corresponds to a quarter wavelength of the incident light source used in the projection printing process.

For example, for 4000 Å incident light, u=1000 Å or 0.1 microns.

Similarly, one or both of the layers 72 and 74 could be comprised of poly-1H, 1H Pentadecafluorooctyl acrylate. One advantage of using either poly-1H, 1H Pentadecafluorooctyl methacrylate or poly-1H, 1H Pentadecafluorooctyl acetate for the antireflective layers 72 and 74 is that these materials have an index of refraction of approximately 1.35 which is extremely low for materials that can be used in forming thin films. Generally, the thickness of the layer u is in the range of 0.05 microns to 0.20 microns and the thickness of the layer v is in the range of 0.5 to 3.0 microns.

EXAMPLE 6

The multi-antireflective layer pellicle 80 is manufactured by a method similar to the method listed in Example 5 except that additional coating and drying steps are needed to account for addition of the outer antireflective layers 86 and 88.

In a typical procedure, a polymer solution is prepared by dissolving 600 g of nitrocellulose in 3000 ml of propylene glycol methyl ether acetate. The polymer solution is spin coated on a clean glass substrate and dried at 60° C. to form the core layer 81. A first coating solution is prepared by dissolving 10 g of novolac resin (e.g. Alnovol PN430 available from Hoechst Celanese) in about 1000 ml of a 50% mixture of butanol and pentanol. The upper inner antireflective layer 82 is formed by spin-coating the first coating solution onto a surface of the core layer 81 and drying the ensemble at 60° C. The upper outer antireflective layer 86 is formed by mixing a 2% solution of poly-1H, 1H Pentadecafluorooctyl methacrylate in a fluoridated hydrocarbon solvent such as 1, 1, 2 trichlorotrifluoroethane with an equal volume of a perfluoroalkane solvent such as 3M's FC 40 to form a second coating solution. A suitable 2% solution of poly-1H, 1H Pentadecafluorooctyl methacrylate is available from 3M under the trademark FC 721. The second coating solution is spin coated onto the inner layer 82 and dried at 60° C. The film comprising the three layers 81, 82 and 86 is peeled away from the glass substrate and is attached to a metal frame that exposes the uncoated side of the core layer 81. The lower inner antireflective layer 84 is formed by spin-coating the first coating solution on the uncoated side of the core layer 81 and drying the ensemble at 60° C. The outer layer 88 is formed by spin-coating the second coating solution onto the inner layer 84 and drying the ensemble at 60° C.

This manufacturing procedure yields the five-layer pellicle 80 having the transmission spectrum 100 shown in FIG. 10. The thicknesses b, c and d for the layers 84, 86 and 81, respectively, are approximately 0.1 microns, 0.1 microns and 2.85 microns. The thicknesses of the layers 82 and 88 are approximately equal to the thicknesses of the layers 84 and 86, respectively. The thicknesses of the layers 82, 84, 86 and 88 are chosen to be approximately light source and are generally in the range of 0.05 microns to 0.2 microns. The thickness of the layer 81 can range from about 0.5 to 3.0 microns.

The pellicle 80 is superior to multi-layer pellicles containing fluoro-polymer antireflective coatings described in the prior art because the chemical compatibility of the layers 81, 82, 84, 86 and 88 reduces peeling between the various layers. Additionally, the indices of refraction of the various layers are well matched so that superior transmission, greater than 98%, is obtained over the range of 350 to 450 nm. Specifically, the outer layers 86 and 88 should have an index of refraction approximately equal to the index of refraction of layer 82 or 84 divided by the square root of the index of refraction of layer 81. In the pellicle 80, the outer layers 86 and 88 should have an index of refraction less than about 1.40.

Although the present invention has been described in terms of the presently preferred embodiment, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

I claim:

1. A pellicle for transmitting mid and deep ultraviolet light for use in a projection printing process comprising:
   a core layer selected from the group consisting of polymethylmethacrylate polymer and polyglycidylemethacrylte; and
   at least one antireflective layer selected from the group consisting of poly-1H, 1H Pentadecafluorooctyl methacrylate and poly-1H, 1H Pentadecafluorooctyl acrylate coated on a surface in close physical proximity to the core layer.

2. A pellicle for transmitting mid and deep ultraviolet light for use in a projection printing process comprising:
   a first layer comprised of polyvinyl butyral polymer of the formula

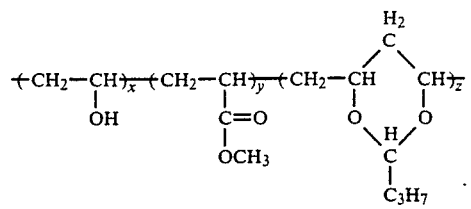

wherein x is in the range of 0.09 to 0.21, y is in the range of 0 to 0.025 and z is in the range of 0.80 to 0.88;
   a second layer comprised of poly-1H, 1H Pentadecafluorooctyl methacrylate coated on a first surface of the first layer; and
   a third layer comprised of poly-1H, 1H Pentadecafluorooctyl methacrylate coated on a second surface of the first layer.

3. The pellicle of claim 2 wherein x is in the approximate range of 0.09 to 0.21 and y is in the approximate range of 0 to 0.025.

4. The pellicle of claim 2 wherein x is in the approximate range of 0.175 to 0.21, y is in the approximate range of 0 to 0.025 and z is approximately 0.80.

5. The pellicle of claim 2 wherein x is in the approximate range of 0.09 to 0.13, y is in the approximate range of 0 to 0.025 and z is approximately 0.80.

6. The pellicle of claim 2 wherein x is in the approximate range of 0.18 to 0.20, y is in the approximate range of 0 to 0.01 and z is approximately 0.80.

7. The pellicle of claim 2 wherein the first layer has a thickness in the approximate range of 0.5 to 3.0 microns.

8. The pellicle of claim 2 wherein the second layer is comprised of poly-1H, 1H Pentadecafluoroocytl acrylate.

9. The pellicle of claim 2 wherein the second and third layers are comprised of poly-1H, 1H Pentadecafluorooctyl acrylate.

10. A pellicle for transmitting mid and deep ultraviolet light for use in a projection printing process comprising:
    a core layer of nitrocellulose;
    a first thin layer comprised of thermoplastic phenolic resin novolac coated on a first surface of the core layer;
    a second thin layer comprised of thermoplastic phenolic resin novolac coated on a second surface of the core layer;
    a third thin layer comprised of a poly-1H, 1H pentadecafluorooctyl methacrylate or poly-1H, 1H pentadecafluorooctyl acrylate material having an index of refraction less than about 1.40 coated on a surface of the first thin layer; and
    a fourth thin layer comprised of a poly-1H, 1H pentadecafluorooctyl methacrylate or poly-1H, 1H pentadecafluorooctyl material having an index of refraction less than about 1.40 coated on a surface of the second thin layer.

11. A pellicle for transmitting mid and deep ultraviolet light for use in a projection printing process comprising:
    a first thin layer comprised of nitrocellulose;
    a second thin layer comprises of novolac coated on a first surface of the first thin layer;
    a third thin layer comprised of poly- 1H, 1H Pentadecafluorooctyl methacrylate coated on a surface of the second thin layer;

a fourth thin layer comprised of novolac coated on a second surface of the first thin layer; and a fifth thin layer comprised of poly-1H, 1H Pentadecafluorooctyl methacrylate coated on a surface of the fourth thin layer.

12. The pellicle of claim 11 wherein,
the first thin layer has a thickness in an approximate range of 0.5 to 3.0 microns.

13. The pellicle of claim 11 wherein,
the second thin layer has a thickness in an approximate range of 0.05 to 0.2 microns.

14. The pellicle of claim 11 wherein,
the third thin layer has a thickness in the approximate range of 0.05 to 0.2 microns.

15. The pellicle of claim 11 wherein,
at least one of the third or fifth thin layers comprises poly-1H, 1H Pentadecafluorooctyl acrylate.

16. A pellicle for use in a projection printing process comprised of polyglycidylmethacrylate-ethylacrylate copolymer capable of transmitting at least approximately sixty percent of incident light where the wavelength of incident light is approximately two hundred and forty nanometers.

17. The pellicle of claim 16 wherein,
the pellicle has a thickness in the approximate range of 0.85 microns to 2.83 microns.

18. A pellicle for transmitting mid and deep ultraviolet light for use in a projection printing processing comprising:

a core layer of polyvinyl butyral polymer of the formula

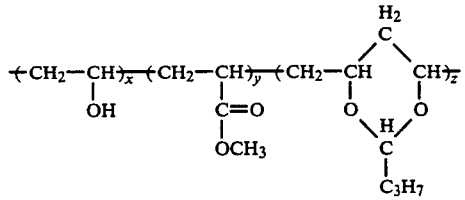

wherein x is in the range of 0.09 to 0.21, y is in the range of 0 to 0.025 and z is in the range of 0.80 to 0.88; and at least one antireflective layer selected from the group consisting of poly-1H, 1H Pentadecafluorooctyl acrylate coated on a surface in close physical proximity to the core layer.

* * * * *